(12) United States Patent
Joshi et al.

(10) Patent No.: US 10,515,871 B1
(45) Date of Patent: Dec. 24, 2019

(54) COOLING DEVICES HAVING LARGE SURFACE AREA STRUCTURES, SYSTEMS INCORPORATING THE SAME, AND METHODS OF FORMING THE SAME

(71) Applicant: Toyota Motor Engineering & Manufacturing North America, Inc., Plano, TX (US)

(72) Inventors: Shailesh N. Joshi, Ann Arbor, MI (US); Naoya Take, Canton, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 0 days.

(21) Appl. No.: 16/164,098

(22) Filed: Oct. 18, 2018

(51) Int. Cl.
| | |
|---|---|
| *H01L 23/34* | (2006.01) |
| *H01L 23/473* | (2006.01) |
| *H01L 23/467* | (2006.01) |
| *H01L 21/48* | (2006.01) |
| *F28F 1/40* | (2006.01) |
| *H01L 23/427* | (2006.01) |

(52) U.S. Cl.
CPC .............. *H01L 23/473* (2013.01); *F28F 1/40* (2013.01); *H01L 21/4871* (2013.01); *H01L 23/427* (2013.01); *H01L 23/467* (2013.01); *F28F 2210/02* (2013.01)

(58) Field of Classification Search
USPC ... 257/712, E51.018, E51.024, 40, 276, 625, 257/675, 707, 713–722, 796, E31.131, 257/E23.051, E23.08–E23.113; 438/122
See application file for complete search history.

(56) References Cited

U.S. PATENT DOCUMENTS

| | | |
|---|---|---|
| 4,753,849 A | 6/1988 | Zohler |
| 7,178,361 B2 | 2/2007 | Thors et al. |
| 8,936,683 B2 | 1/2015 | Marshall |
| 2010/0200199 A1 | 8/2010 | Habib et al. |
| 2015/0056438 A1* | 2/2015 | Lim .................. C09D 5/00 |
| | | 428/313.9 |
| 2016/0363355 A1 | 12/2016 | Maurer et al. |
| 2018/0066131 A1* | 3/2018 | Jin .................. C08L 25/06 |
| 2019/0229083 A1* | 7/2019 | Joshi ................ H01L 24/73 |
| 2019/0239395 A1* | 8/2019 | Joshi .............. H05K 7/20936 |

* cited by examiner

*Primary Examiner* — Niki H Nguyen
(74) *Attorney, Agent, or Firm* — Dinsmore & Shohl LLP

(57) ABSTRACT

Cooling devices, systems including cooling devices, and methods of forming tubes for cooling devices are disclosed. A method for forming a tube for a cooling device includes positioning an opal structure on an interior surface of the tube, the opal structure having voids around a plurality of spheres, depositing a material over the opal structure and within the voids around the plurality of spheres, and removing the opal structure such that the material forms a patterned structure having a plurality of dimples and a plurality of pores.

20 Claims, 8 Drawing Sheets

US 10,515,871 B1

COOLING DEVICES HAVING LARGE SURFACE AREA STRUCTURES, SYSTEMS INCORPORATING THE SAME, AND METHODS OF FORMING THE SAME

BACKGROUND

Field

The present specification generally relates to enhanced surface areas for heat transfer applications and, more particularly, to heat transfer tubes that have large surface areas for heat transfer.

Technical Background

Electronic devices may generally be coupled to cooling devices that remove heat generated by the electronic devices so as to minimize device damage, maintain or increase the efficiency of the functionality of the electronic device, and/or the like.

As electronic devices become smaller, the components used to cool the electronic devices are generally also reduced in size. However, typical processes for forming surface features on cooling devices cannot be used when the cooling devices are smaller than a particular size.

SUMMARY

In one embodiment, a method for forming a tube for a cooling device includes positioning an opal structure on an interior surface of the tube, the opal structure having voids around a plurality of spheres, depositing a material over the opal structure and within the voids around the plurality of spheres, and removing the opal structure such that the material forms a patterned structure having a plurality of dimples and a plurality of pores.

In another embodiment, a cooling device includes at least one tube having an outside diameter of less than one millimeter. The at least one tube includes a tube wall defining a hollow interior and having an interior surface, and a patterned structure disposed on the interior surface. The patterned structure has an inverse opal structure.

In yet another embodiment, a system includes a heat generating device and a cooling device thermally coupled to the heat generating device. The cooling device includes at least one tube having an outside diameter of less than one millimeter. The at least one tube includes a tube wall defining a hollow interior and having an interior surface, and a patterned structure disposed on the interior surface. The patterned structure has an inverse opal structure.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, wherein like structure is indicated with like reference numerals and in which:

DETAILED DESCRIPTION

The present disclosure relates generally to cooling devices for cooling heat generating devices, particularly cooling devices that utilize sub-millimeter sized cooling tubes to direct fluid to a location adjacent to a heat generating device (e.g., an electronic device) to be cooled. The sub-millimeter sized cooling tubes described herein generally have a patterned internal surface that provides a greater surface area for heat transfer relative to similar tubes that do not have a patterned internal surface or have a differently patterned internal surface. The present disclosure further relates to a particular method of forming a pattern of material on the internal surface of the cooling tubes. The sub-millimeter sized cooling tubes described herein are particularly adapted for providing cooling surfaces with a maximized surface area in electronics assemblies that necessitate the need for sub-millimeter sized cooling tubes.

Figure 1:
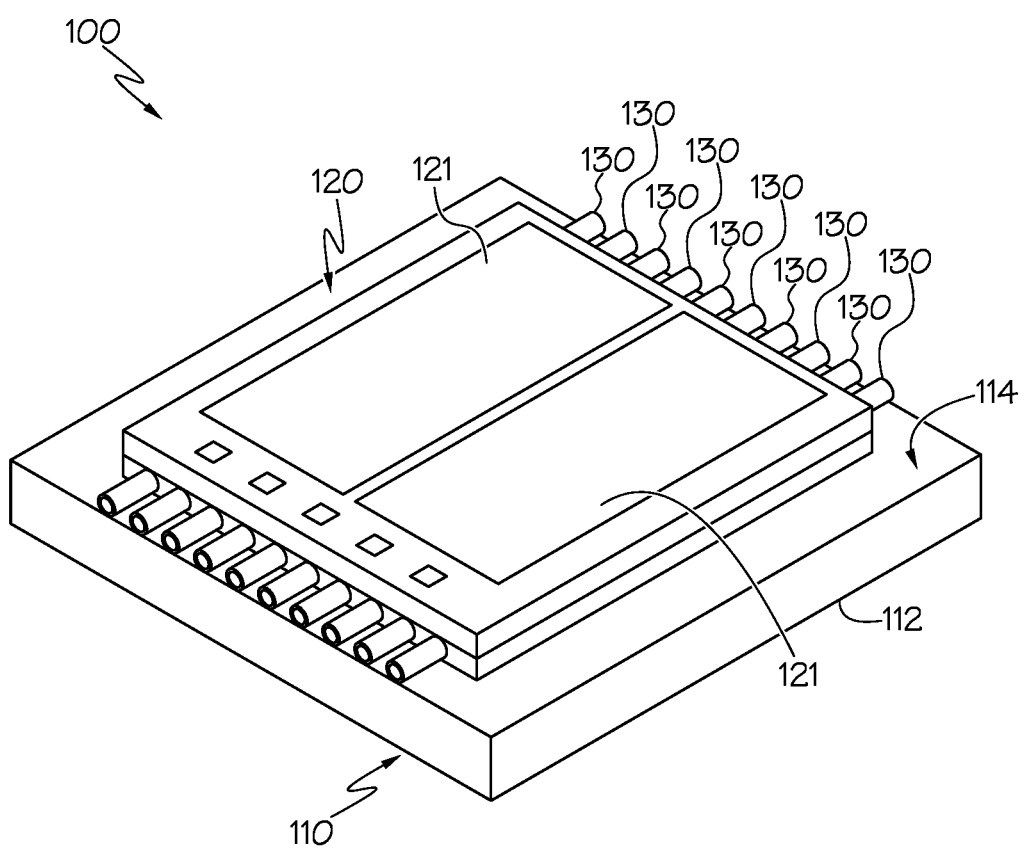
FIG. 1 schematically depicts an illustrative stack including an electronic device coupled to a cooling device according to one or more embodiments shown and described herein.

Referring now to the drawings, FIG. 1 depicts a stack, generally designated 100, according to various embodiments. The stack 100 may generally be a system including a cooling device 110 thermally coupled to one or more heat generating devices 121. The cooling device 110 generally includes at least a substrate 112 (e.g., a collector or the like) coupled to or integrated with one or more cooling tubes 130 that are coupled to (e.g., embedded within) an assembly 120 that supports the one or more heat generating devices 121 thereon or integrates the one or more heat generating devices 121 therein. That is, in some embodiments, he one or more cooling tubes 130 may be positioned on a surface 114 of the substrate 112 and may directly contact the one or more heat generating devices 121 within the assembly 120. In some embodiments, the one or more cooling tubes 130 may be embedded within the assembly 120 that contains the one or more heat generating devices 121 so as to maximize the heat transfer surface area of each of the one or more cooling tubes 130. As such, the one or more cooling tubes 130 are generally positioned between the substrate 112 and the one or more heat generating devices 121. However, the present disclosure is not limited to such. That is, the one or more cooling tubes 130 may be positioned in any other manner so long as the one or more cooling tubes 130 contact the one or more heat generating devices 121 and/or are integrated with the assembly 120 and/or the one or more heat generating devices 121 (or a component thereof) to draw heat flux from the one or more heat generating devices 121. Thus, as the one or more heat generating devices 121 generate heat, the heat is drawn away from the one or more heat generating devices 121 via the one or more cooling tubes 130.

The one or more heat generating devices 121 are not limited by the present disclosure, and may each generally be any device that generates heat as a byproduct of operation. In some embodiments, the one or more heat generating devices 121 may be shaped and/or sized so as to necessitate sub-millimeter sized cooling tubes 130, as described herein. That is, the one or more heat generating devices 121 may be a shape and/or a size such that cooling tubes that are greater than about 1 mm in outside diameter are ineffective in drawing heat away from the one or more heat generating devices 121, thereby necessitating sub-millimeter sized cooling tubes 130 to effectively draw heat away from the one or more heat generating devices 121. In some embodiments, the one or more heat generating devices 121 may each be a semiconductor device such as, for example, an insulated-gate bipolar transistor (IGBT), a diode, a transistor, an integrated circuit, a silicon-controlled rectifier (SCR), a thyristor, a gate turn-off thyristor (GTO), a triac, a bipolar junction transistor (BJT), a power metal oxide semiconductor field-effect transistor (MOSFET), a MOS-controlled thyristor (MCT), an integrated gate-commutated thyristor (IGCT), or the like. In a particular embodiment, the one or more heat generating devices 121 may include a wide bandgap semiconductor device. Other examples of the one or more heat generating devices 121 not specifically described herein should generally be understood, and are included within the scope of the present disclosure.

The cooling device 110 may generally be any device or system that cools via heat transfer, particularly devices or systems that direct a cooling fluid via one or more tubes. Illustrative examples of devices or systems that cool via heat transfer (e.g., via heat exchange) include, but are not limited to, pool boiling units, heat pipe assemblies, heat spreaders, vapor chambers, thermoelectric cooling devices, thermal diodes, and other heat exchange devices not specifically described herein. The devices and systems may generally incorporate and/or may be fluidly coupled to the one or more cooling tubes 130 to direct cooling fluid into the one or more cooling tubes 130 and/or to remove heated cooling fluid from the one or more cooling tubes 130. As such, the cooling tubes 130 may be fluidly coupled to one or more additional components (not shown) for the purposes of directing fluid therethrough.

In some embodiments, the cooling device 110 may be an active heat management device. That is, the cooling device 110 actively draws heat from the one or more heat generating devices 121 by flowing a cooling fluid through the one or more cooling tubes 130. However, the cooling device 110 may be a passive heat management device in other embodiments. That is, the cooling device 110 (and particularly the cooling tubes 130 therein) may act as devices that are particularly configured to dissipate the heat generated by the one or more heat generating devices 121 by providing an increased surface area for heat dissipation. As active and passive heat management are generally understood, such details are not described further herein.

The one or more cooling tubes 130 may generally be any tubes that allow fluid flow therethrough. The length of the one or more cooling tubes 130 is not limited by the present disclosure, and may generally be any length. In the embodiment depicted in FIG. 1, the cooling tubes 130 generally have the same length. However, the present disclosure is not limited to such. That is, each of the cooling tubes 130 may have a different length relative to other ones of the cooling tubes 130 in some embodiments. Also in the embodiment depicted in FIG. 1 are ten (10) cooling tubes 130. However, the present disclosure is not limited to such. That is, the number of cooling tubes 130 may be greater than or less than ten cooling tubes 130. In addition, the arrangement and configuration of the cooling tubes 130 as depicted in FIG. 1 (e.g., generally aligned and coplanar with one another) is also merely illustrative, and other arrangements and configurations are contemplated. The cooling tubes 130 may be straight tubes in some embodiments (as depicted in FIG. 1 for example) or may be bent, angled, or otherwise curved without departing from the scope of the present disclosure. The cooling tubes 130 may be formed from any material, particularly materials exhibiting a high thermal conductivity. That is, the cooling tubes 130 may generally be formed from materials that are generally understood to be used for thermal conduction, such as, for example, copper, copper alloys, nickel, nickel alloys, silver, silver alloys, zinc, zinc alloys (e.g., brass), and/or the like. In some embodiments, the cooling tubes 130 may adhere to certain standards, such as, for example, ASTM B280 and ASTM B360 standards. The cooling tubes 130 may generally be any yet-to-be-developed or commercially available tubes, such as, without limitation, tubes available from Precision Tube Company (North Wales, Pa.), Tube Methods, Inc. (Bridgeport, Pa.) G & J Steel & Tubing, Inc. (Hillsborough, N.J.), Metal Works Corporation (Baton Rouge, La.), and Fujikura Ltd. (Tokyo, Japan).

In some embodiments, the cooling tubes 130 have a sub-millimeter outside diameter. That is, the cooling tubes 130 described herein may generally have a diameter that is less than about 1 millimeter (mm) when measured from points along an outside surface. For example, the outside diameter of each of the cooling tubes 130 may be about 0.9 mm, about 0.8 mm, about 0.7 mm, about 0.6 mm, about 0.5 mm, about 0.4 mm, about 0.3 mm, about 0.2 mm, about 0.1 mm, smaller than 0.1 mm, or any value or range between any two of these values (including endpoints). In some embodiments, each of the cooling tubes 130 may have a uniform outside diameter. In other embodiments, the cooling tubes 130 may have varying outside diameters. The patterned inside surface of the cooling tubes 130, as well as the method for forming the patterned inside surface, is particularly adapted for cooling tubes 130 having a sub-millimeter outside diameter. Additional details regarding the patterned inside surface of the cooling tubes 130 and the method of forming a patterned structure on the inside surface will be described in greater detail hereinbelow. While sub-millimeter outside diameter cooling tubes 130 are generally discussed herein, the present disclosure is not limited to such. That is, the cooling tubes 130 may have an outside diameter that is greater than about 1 mm in some embodiments.

The substrate 112 of the cooling device 110 is not limited by the present disclosure, and may generally be any substrate, particularly substrates that are adapted to support cooling tubes 130 embedded in the assembly 120 thereon, such as, for example, substrates constructed of a thermally conductive material. Substrates that are used for heat exchange devices should be generally understood, particularly those that are formed of a thermally conductive material, and are not described in further detail herein. The substrate 112 may be any shape or size, and is not limited by the present disclosure. In some embodiments, the substrate 112 may be shaped and/or sized to correspond to a shape and/or size of the one or more heat generating devices 121. In the embodiment depicted in FIG. 1, the substrate 112 may be sized such that it is generally larger than the one or more heat generating devices 121 (e.g., the substrate 112 has a footprint that is larger than the footprint of the one or more heat generating devices 121). In some embodiments, the substrate 112 may be shaped, sized, and configured to support a single heat generating device 121 thereon. In other embodiments, the substrate 112 may be shaped, sized, and configured to support a plurality of heat generating devices 121 thereon. In some embodiments, the substrate 112 may be a collector for an IGBT.

In some embodiments, at least a portion of the cooling tubes 130 may be fixed to the substrate 112 via soldering, transient liquid phase (TLP) bonding, or the like. For example, for a TLP bonding process, at least a portion of the cooling tubes 130 may be fixed to the substrate 112 by providing a low melting temperature material (e.g., tin or indium) adjacent to a high melting temperature material (e.g., copper, nickel, or aluminum) where the low melting temperature material has a lower melting temperature than the high melting temperature material. The low melting temperature material and the high melting temperature material may be provided via thin films and/or via individual particles or core/shell particles including the low and high melting temperature materials. The cooling tubes 130 and the substrate 112 may have a coating or layer of a high melting temperature material. During TLP bonding, the cooling tubes 130, the low and high melting temperature materials, and the substrate 112 are subjected to a sintering temperature greater than the melting temperature of the low melting temperature material (e.g., between about 280° C. and about 350° C.) for a period of time. The sintering temperature causes the low melting temperature material to melt and diffuse into the high melting temperature material, thereby forming one or more intermetallic compound layers that bond the cooling tubes 130 to the substrate 112. The one or more intermetallic compound layers (i.e., TLP bond layers) have a melting temperature that is greater than the sintering temperature. It should be understood that TLP bonding may be particularly used in instances where the heat generating device 121 is a wide bandgap semiconductor device that operates at a relatively high temperature (e.g., at a temperature of about 200° C. or greater than about 200° C.) because the TLP bond layers adhere the components at relatively high temperatures better than a solder layer.

In other embodiments, at least a portion of the cooling tubes 130 may be integrated with the substrate 112. For example, at least a portion of the cooling tubes 130 may be sandwiched between substrate layers and/or the substrate 112 may be formed around at least a portion of the cooling tubes 130.

Figure 2:
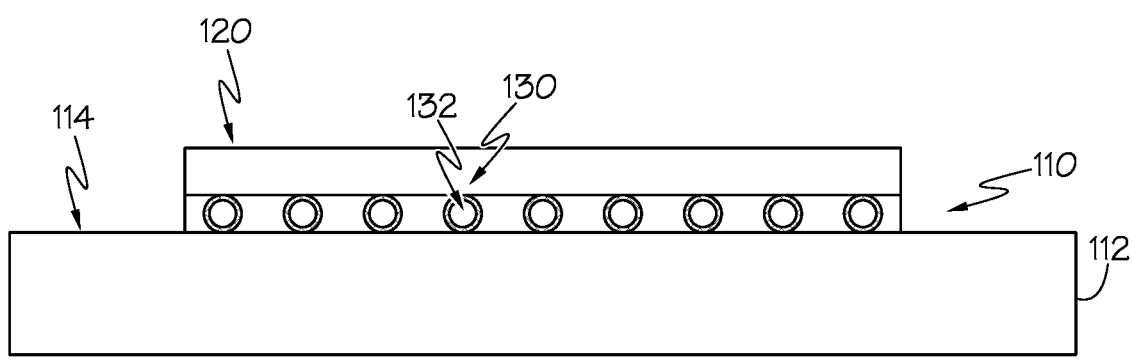
FIG. 2 schematically depicts a side view of the illustrative stack of FIG. 1.

FIG. 2 depicts a side view of the stack 100 according to various embodiments. As shown in FIG. 2, the stack 100 includes the surface 114 of the substrate 112 supporting the one or more tubes 130 thereon, which, in turn, contact the one or more heat generating devices 121. While not shown in FIG. 2, the stack 100 may be bonded (e.g., via TLP bonding), soldered, and/or the like such that the one or more cooling tubes 130 are fixed between the substrate and the one or more heat generating devices 121. That is, a solder or bonding material (e.g., a TLP bonding material such as an alloy of a low melting temperature material (e.g., tin or indium) and a high melting temperature material (e.g., copper, nickel, or aluminum)) may be dispersed between the one or more cooling tubes 130 and between the substrate 112 and the one or more heat generating devices 121 to secure the various components of the stack 100 together. In some embodiments, the stack 100 may be arranged such that a first solder layer or bond layer (e.g., TLP bond layer) is disposed on the surface 114 of the substrate 112, the one or more cooling tubes 130 are disposed on the first solder layer or bond layer, a second solder layer or bond layer (e.g., TLP bond layer) is disposed on the one or more cooling tubes 130, and the one or more heat generating devices 121 are disposed on the second solder layer or bond layer.

Each of the tubes 130 may have a pattern on the interior and/or exterior thereof to maximize surface area for heat transfer, as described in greater detail herein. That is, the surface area of the interior and/or the exterior of each of the tubes 130 may be increased via the processes described herein for the purposes of increasing heat transfer, as it is generally understood that increased surface area increases heat transfer. While the present disclosure relates generally to increasing the surface area on the interior of each of the tubes 130, it should be understood that, in some embodiments, a similar process may also be completed on the exterior of the tubes 130 without departing from the scope of the present disclosure.

Figure 3A:
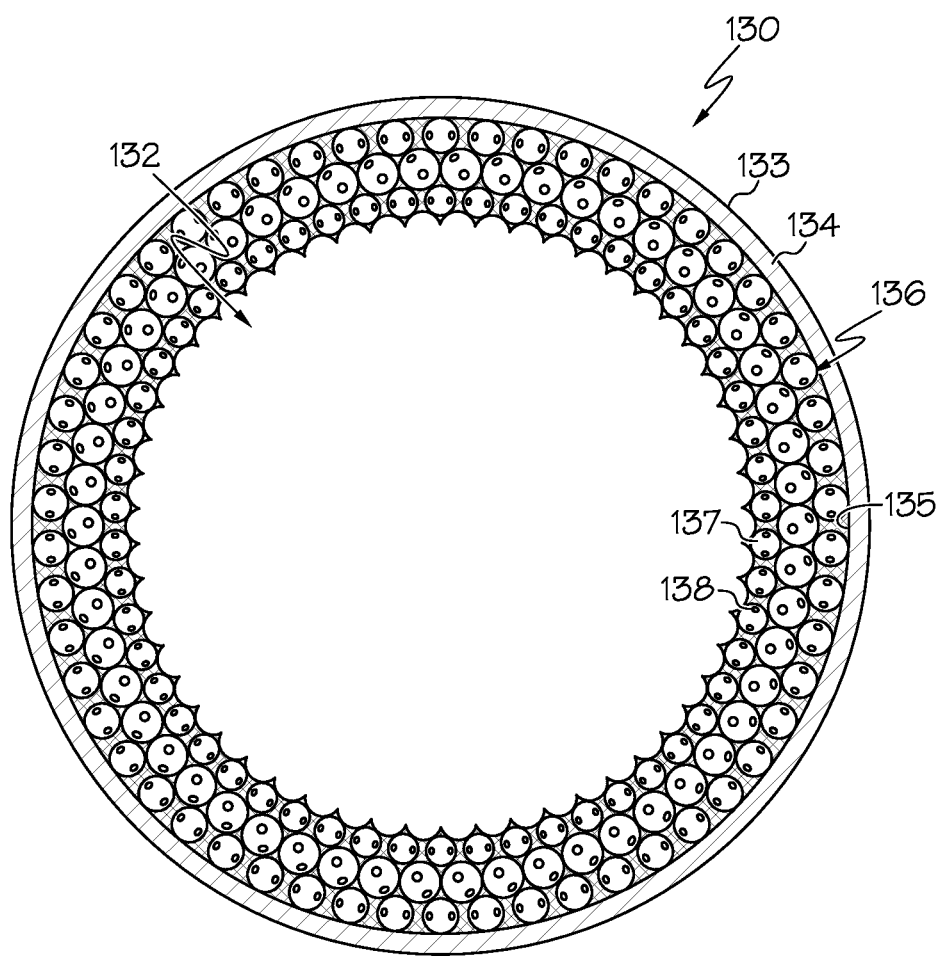
FIG. 3A schematically depicts a cutaway view of a patterned interior of a cooling tube in a cooling device according to one or more embodiments shown and described herein.
Figure 3B:
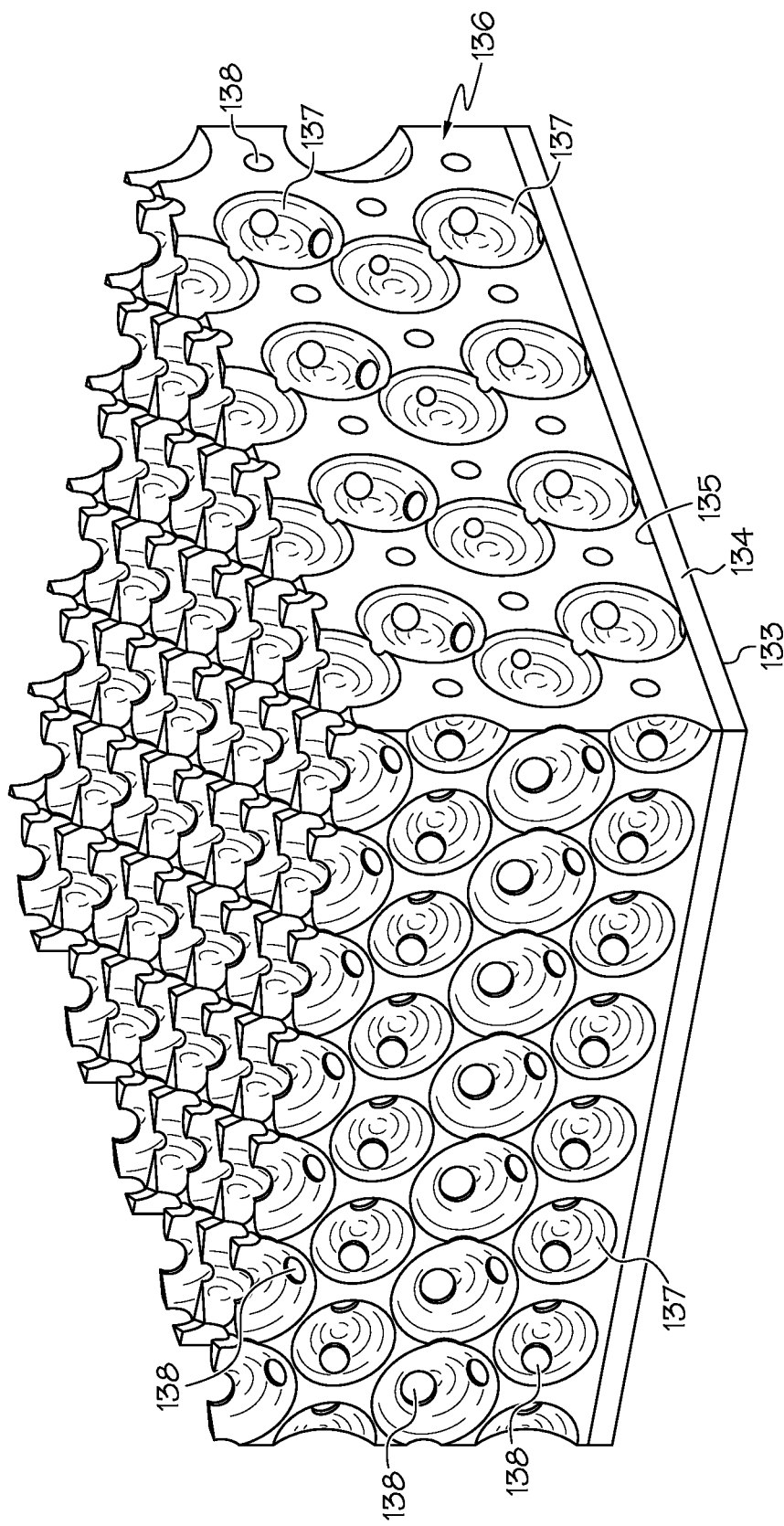
FIG. 3B schematically depicts a detailed perspective view of a patterned interior of a cooling tube in a cooling device according to one or more embodiments shown and described herein.

As generally depicted in FIG. 2 and shown in greater detail in FIGS. 3A-3B, each of the one or more tubes 130 is hollow such that a hollow interior 132 of the cooling tube 130 allows a fluid (e.g., a cooling fluid) to pass therethrough. That is, the cooling tube 130 includes a tube wall 134 having an exterior surface 133 and an interior surface 135, the tube wall 134 defining the hollow interior 132 of the cooling tube 130. The tube wall 134 and the hollow interior 132 are not limited in dimensional characteristics by this disclosure. That is, the tube wall 134 may have any shape, size, and thickness and the hollow interior 132 defined by the tube wall 134 may also be any shape or size, particularly shapes and sizes that allow for deposition of a patterned structure on the interior surface 135 of the tube wall 134 while still maintaining a space therein for fluid flow, as described in greater detail herein.

The hollow interior 132 of the cooling tube 130 is further configured to maximize surface area that is contactable by the fluid flowing therethrough. That is, the interior surface 135 of the tube wall 134 may have a patterned structure 136 thereon that is particularly formed to maximize an amount of surface area on the interior of the cooling tube 130 to increase heat transfer. In some embodiments, the patterned structure 136 may be any inverse opal structure, such as, for example, a metal inverse opal (MIO) structure (e.g., a copper inverse opal (CIO) structure, a nickel inverse opal (NIO) structure, or the like) or the like. Accordingly, as depicted in FIGS. 3A-3B, the patterned structure 136 located on the interior surface 135 of the tube wall 134 may have a plurality of dimples 137 (or other similar depression or indentation) and a plurality of pores 138 such that fluid present within the interior of the cooling tube 130 can flow through each of the plurality of networked pores 138 throughout the patterned structure and contact a greater amount of surface area for the purposes of heat transfer. It should be understood that inverse opal structures (including MIO structures) have a high permeability as inverse opal wick structures provide the advantage of improved control over pore sizes and distribution. While the dimples 137 and the pores 138 are specifically shown and described herein, other surface features contained within the patterned structure 136 may also be included without departing from the scope of the present disclosure. In addition, it should be understood that FIGS. 3A-3B are provided for illustrative purposes only and embodiments disclosed herein are not limited to the patterned structure 136 depicted in FIGS. 3A-3B. Moreover, while the tube wall 134 in FIGS. 3A-3B appears to be generally planar (i.e., not curved as depicted in FIG. 2), this is merely for illustrative purposes. That is, the tube wall 134 may be planar, curved, angled, and/or the like without departing from the scope of the present disclosure.

The number of dimples 137, pores 138, and/or other surface features present in the patterned structure 136 is not limited by the present disclosure, and may be any number so long as the connectivity between the material of the patterned structure 136 and the interior surface 135 of the tube wall 134 is maintained. Thus, as fluid flows through the dimples 137, pores 138 and/or other surface features of the patterned structure 136 of the interior surface 135 of the tube wall 134, latent heat carried from the fluid is transferred through the tube wall 134 to other portions of the cooling device 110 (FIG. 2) to draw heat away from the one or more heat generating devices 121. In some embodiments, heat can be transferred to the fluid from the patterned structure 136 and/or the tube wall 134 such that the fluid carries the heat away from the tubes 130 (FIG. 2). As particularly shown in FIG. 3B, each dimple 137 of the patterned structure 136 may have at least two pores 138 therein to maximize fluid flow through each of the dimples 137.

While the dimples 137 depicted in FIGS. 3A-3B appear generally spherical in shape, this is merely illustrative. That is, the dimples 137 may be any shape (including irregular shapes). The shape of the dimples 137 may be determined from the shape of the materials used to form the patterned structure 136, as described in greater detail herein.

The thickness of the patterned structure 136 is not limited by the present disclosure, and may generally be any thickness. In some embodiments, the thickness of the patterned structure 136 may be such that the patterned structure 136 fills the entire hollow interior 132 of the cooling tube 130. In other embodiments, the thickness of the patterned structure 136 may be such that a space is maintained within a central part of the hollow interior 132, as depicted in FIG. 3A for example.

The patterned structure 136 may generally be constructed of a thermally conductive material, but is otherwise not limited by the present disclosure. In some embodiments, the material used for the patterned structure 136 may be selected based on the process used to form the patterned structure 136, as described in greater detail herein. For example, if the patterned structure 136 is formed from an MIO formation process, metals that are suitable for such a formation process may be used. Illustrative examples of materials that may be used include, but are not limited to, aluminum, nickel, copper, silver, gold, an alloy containing any of the foregoing, a compound containing any of the foregoing, and the like. Other materials that are generally understood to result from an inverse opal formation process that are not specifically disclosed herein are also included within the scope of the present disclosure.

In some embodiments, the patterned structure 136 in each of the tubes 130 may be particularly configured for the purposes of active cooling, as described herein. That is, the tubes 130 are used to flow a cooling fluid therethrough to draw latent heat away from a heat generating device 121. In other embodiments, the patterned structure 136 in each of the tubes 130 may be particularly configured for the purposes of passive cooling. That is, the patterned structure 136 may function similar to that of a finned surface or the like to dissipate heat in a passive manner (e.g., acts as a heat spreader), as is generally understood.

In some embodiments, the patterned structure 136 may be at least partially coated with an electrical insulator material that electrically insulates the patterned structure 136 from other components that would otherwise contact the patterned structure. For example, the patterned structure 136 may be electrically insulated from the cooling fluid that is passed through the cooling tubes 130 during operation, so as to avoid instances where the cooling fluid corrodes or otherwise causes damage to various components of the stack 100 (FIG. 1). Illustrative examples of the electrical insulator material that may be formed on the patterned structure 136 may include, but are not limited to, alumina and silicon dioxide ($SiO_2$). The insulator material may be formed on the patterned structure 136 via any deposition method now known or later developed, particularly deposition methods that are suited for the materials used. In some embodiments, the insulator material may be deposited on the patterned structure 136 via atomic layer deposition (ALD) or chemical vapor deposition (CVD) processes.

Figure 4:
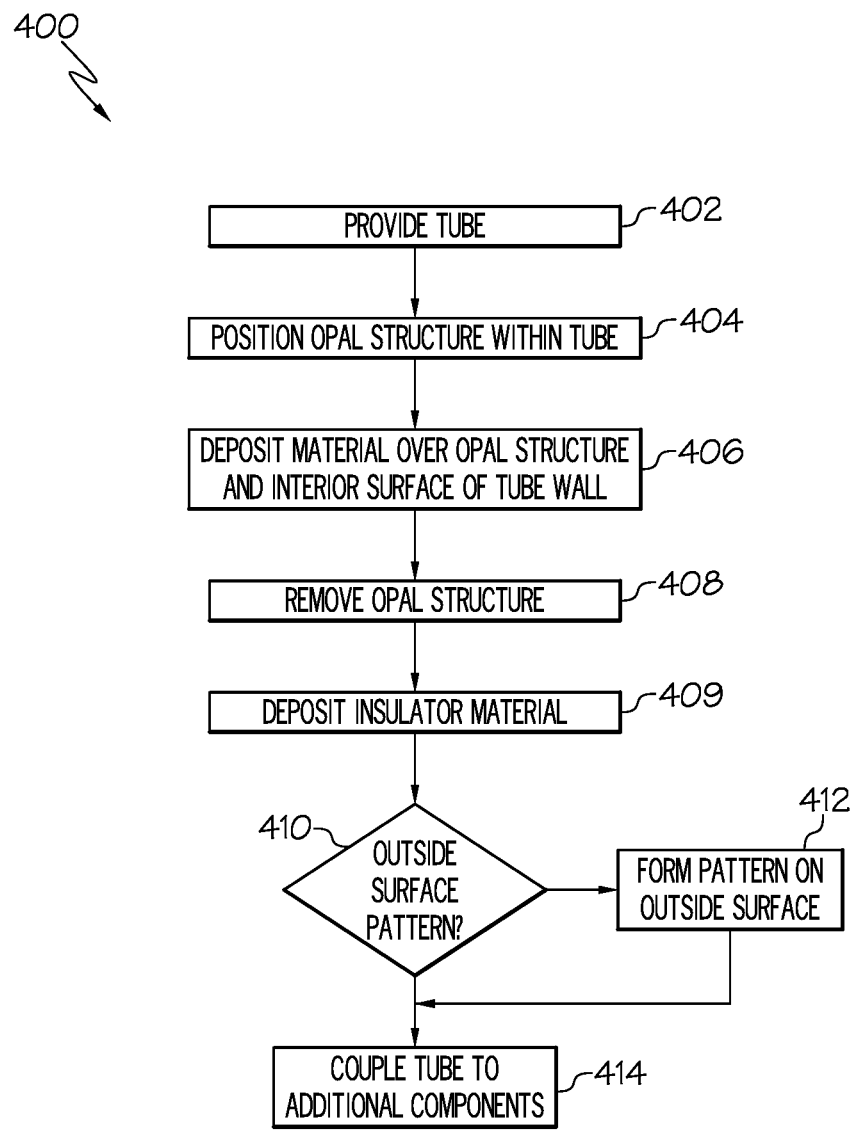
FIG. 4 depicts a flow diagram of an illustrative method of forming a cooling tube having a patterned interior according to one or more embodiments shown and described herein.

FIG. 4 depicts an illustrative process of forming a cooling tube having a patterned interior (e.g., a patterned structure formed on the interior surface of a tube wall) according to various embodiments. The process described with respect to FIG. 4 may generally achieve a patterned structure 136 (FIGS. 3A-3B) that has an inverse opal structure. However, it should be understood that other processes to achieve the patterned structure 136 may also be used without departing from the scope of the present disclosure. The process depicted with respect to FIG. 4 may also be used to form a cooling device, such as the cooling device 110 (FIGS. 1-2) described herein.

Referring generally to FIGS. 1-4, a cooling tube 130 may be provided at block 402. In some embodiments, the tube 130 may be particularly shaped, sized, and configured according to certain specifications (e.g., for a particular cooling application). In other embodiments, the tube 130 may be a standard size, length, and/or shape (e.g., a straight length of tube) and must be particularly formed (e.g., cut, bent, etc.) for a particular application as part of the providing step of block 402. As such, in some embodiments, providing the tube according to block 402 may further include forming the tube by cutting, bending, and/or the like to suit a particular application.

Figure 5A:
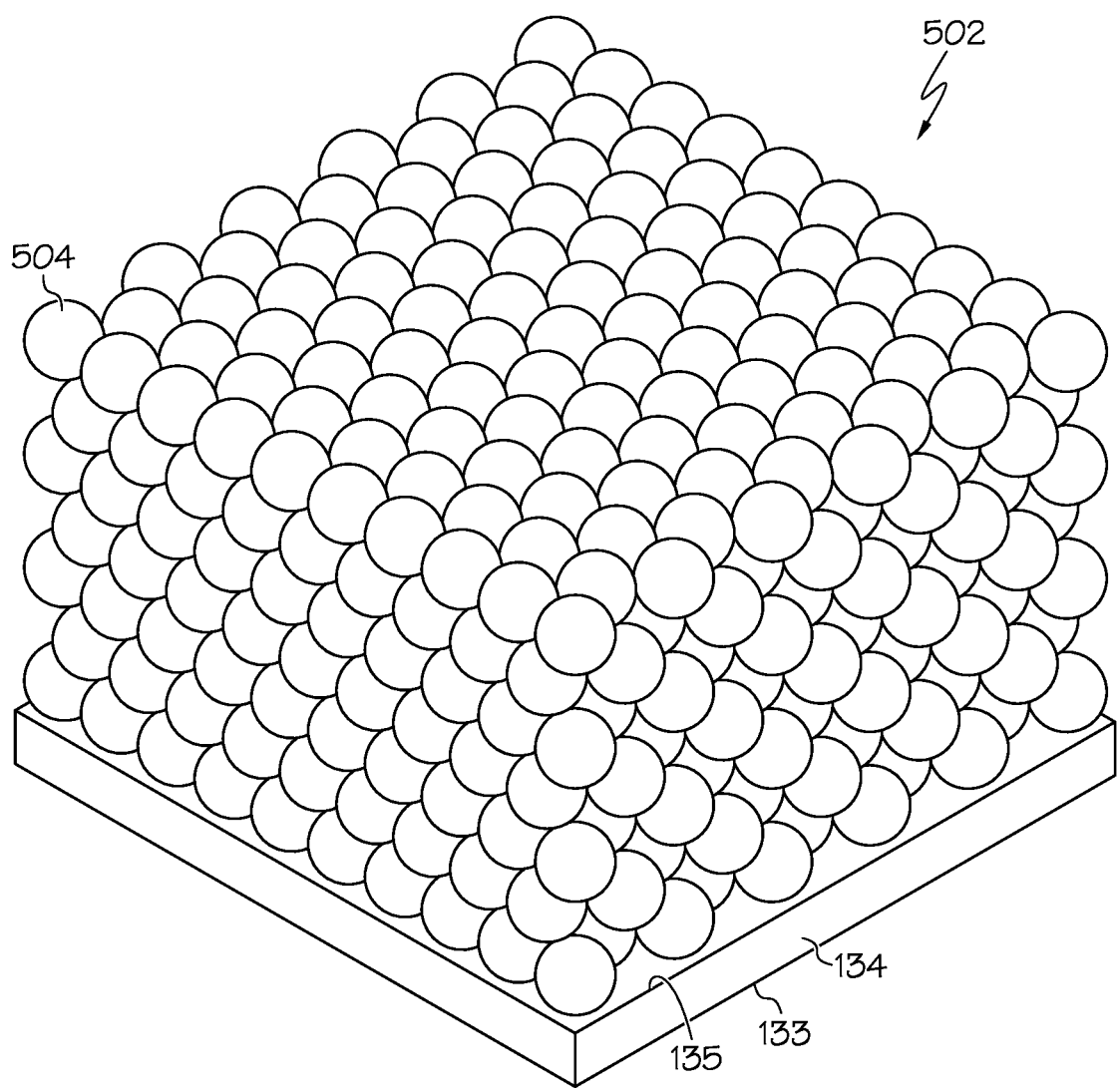
FIG. 5A schematically depicts a detailed perspective view of an opal structure deposited on an interior surface of a tube wall of a cooling tube according to one or more embodiments shown and described herein.

Referring to FIGS. 1, 4, and 5A, an opal structure 502 may be positioned within the cooling tube 130 (e.g., in the hollow interior 132 (FIG. 3A) of the cooling tube 130) at block 404. More particularly, the opal structure 502 may be positioned on the interior surface 135 of the tube wall 134 in a location where a patterned structure is desired. The opal structure 502 may generally be a lattice of material (e.g., a mesh) that is shaped, sized, and configured to form the dimples 137, pores 138, and/or other surface features of the patterned structure 136 in the negative space that remains after removal of the opal structure 502, as described herein. Accordingly, the opal structure 502 may generally be constructed of a material that can later be dissolved, etched, or otherwise removed without altering the shape of the dimples 137, pores 138, and/or other surface features, as described herein. In some embodiments, the opal structure 502 may be a polymer material, such as, for example, a polystyrene opal structure. In some embodiments, the opal structure 502 may be provided as a film, such as a polystyrene opal film. In other embodiments, the opal structure 502 may be a self-assembled opal structure.

Several methods of constructing the opal structure 502 are possible. One illustrative method to synthesize the opal structure 502 is via a controlled withdrawal process whereby a colloidal suspension of spheres is provided within the tube 130 (e.g., within an open end of the tube 130), a substrate is inserted into the suspension in order to create a meniscus line within the tube 130, and the suspending agent (e.g., water) is slowly evaporated. The surface tension of the evaporating suspending agent at the top of the meniscus line pulls the spheres into a closely packed array no more than a few layers thick, leaving the opal structure 502 of spheres within the tube 130. This opal structure 502 of spheres, as depicted in FIG. 5A, is arranged such that plurality of voids 504 are present around each of the spheres of the opal structure 502. The voids 504 receive material that is used to form the patterned structure 136 (FIG. 3A), as described hereinbelow.

Figure 5B:
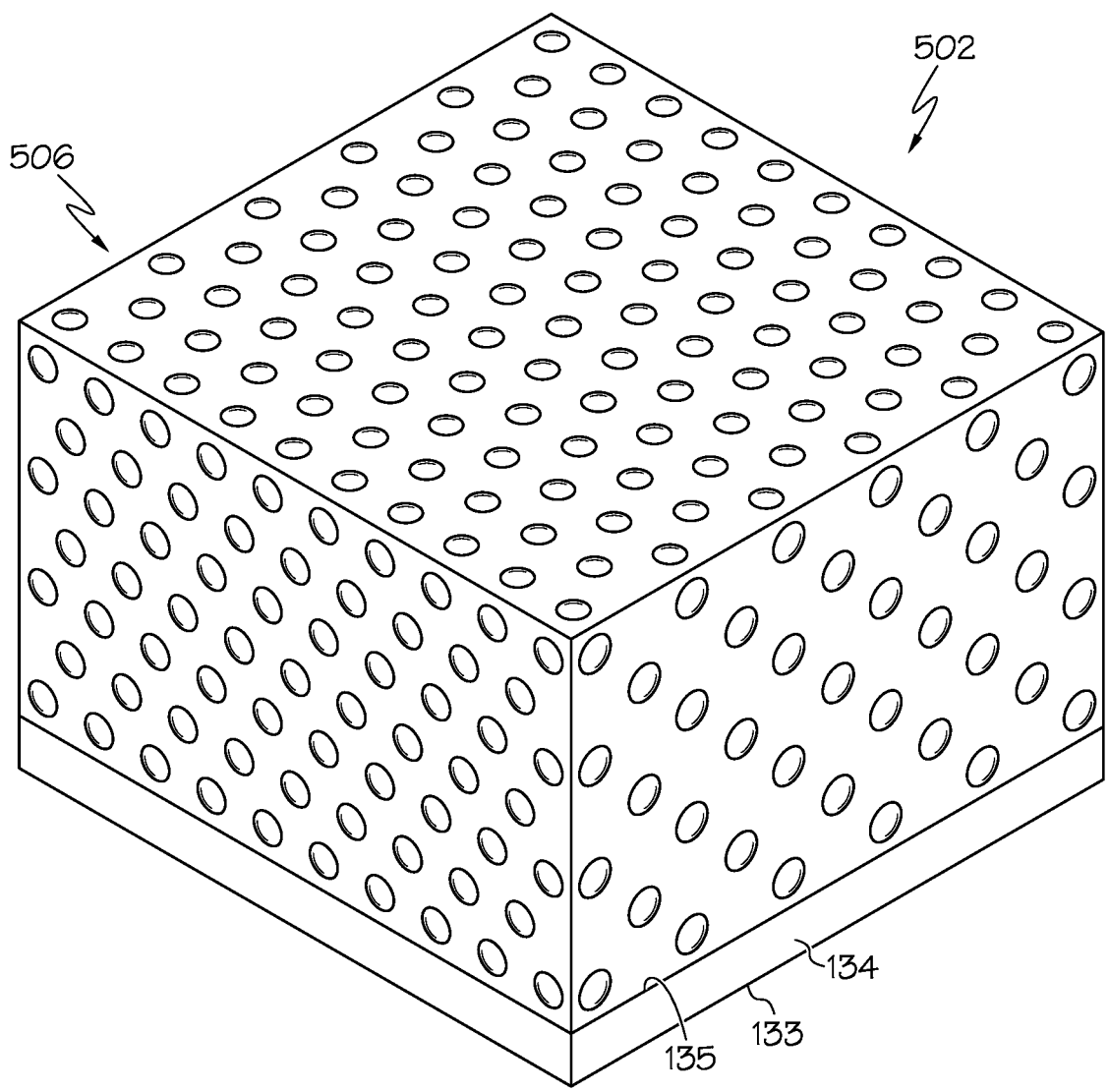
FIG. 5B schematically depicts a material deposited over the opal structure of FIG. 5A according to one or more embodiments shown and described herein.

Referring now to FIGS. 4 and 5B, material 506 may be deposited over the opal structure 502 and the interior surface 135 of the tube wall 134 at block 406. The material 506 may generally be deposited such that the material 506 fills the voids 504 (FIG. 5A) around the spheres of the opal structure 502. The material 506 that is deposited is generally the material that results in the patterned structure 136 (FIGS. 3A-3B) described herein. That is, the material 506 may be aluminum, nickel, copper, silver, gold, an alloy containing any of the foregoing, a compound containing any of the foregoing, and the like. Additional materials may also be used without departing from the scope of the present disclosure.

Still referring to FIGS. 4 and 5B, the material 506 may be deposited via any generally recognized method of deposition, such as, for example, chemical vapor deposition (CVD), electrodeposition, epitaxy, and thermal oxidation. In some embodiments, physical vapor deposition (PVD) or casting may also be used to deposit the material 506. It should be understood that the deposition process does not completely fill the interstitial spaces (e.g., the voids 504), but rather creates a layer of material around the spheres such that, when removed, the dimples 137, pores 138, and/or other surface features of the patterned structure 136 (FIGS. 3A-3B) are formed.

Figure 5C:
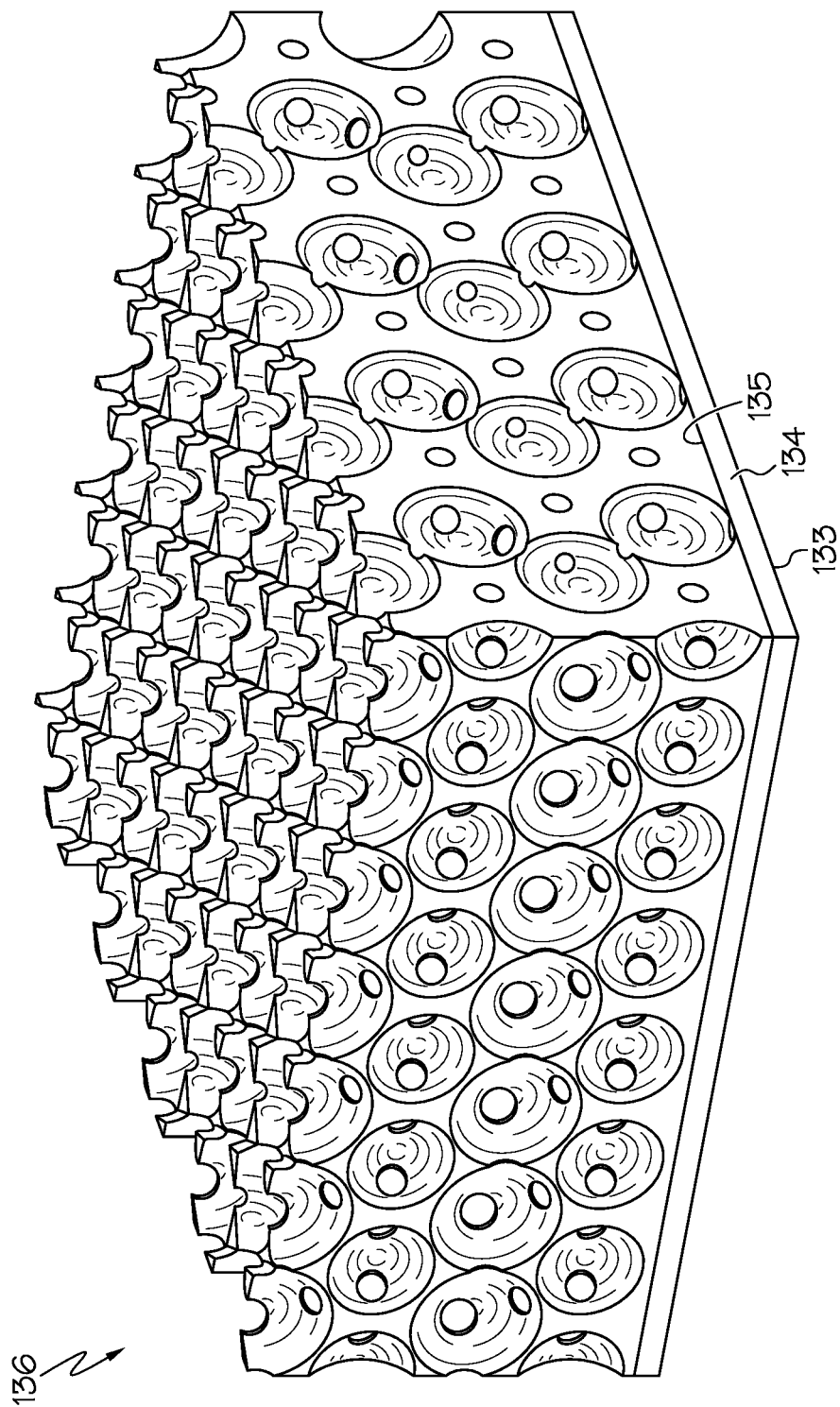
FIG. 5C schematically depicts the material of FIG. 5B with the opal structure removed, thereby forming patterned structure according to one or more embodiments shown and described herein.

Referring to FIGS. 4 and 5B-5C, the opal structure 502 may be removed at block 408 such that the material 506 formed around the opal structure 502 remains as the patterned structure 136 having the dimples 137, pores 138, and/or other surface features. Removal of the opal structure 502 may generally be completed via any removal processes, particularly removal processes that are suitable for removing the material used for the opal structure 502 (e.g., polystyrene material) but not the material 506. For example, an etching process may be used to remove the opal structure 502. That is, an etchant may be applied to the opal structure 502 and the material 506 (e.g., by placing the opal structure 502 and the material 506 in an etchant bath) to etch away the opal structure 502. In some embodiments, a hydrofluoric acid solution may be used as an etchant to etch away the opal structure 502. Other methods that cause the opal structure 502 to be removed or otherwise dissolved should generally be understood. As a result of this process, the patterned structure 136 is formed on the interior surface 135 of the tube wall 134.

Referring to FIGS. 4 and 5C, an insulator material (not shown) may be deposited on the patterned structure 136 at block 409. That is, a material such as alumina, silicon dioxide ($SiO_2$), and/or the like may be deposited on the patterned structure 136 via atomic layer deposition, chemical vapor deposition, and/or the like to at least partially coat the patterned structure 136 and isolate at least a portion of the patterned structure 136 from other components and/or materials, as described herein.

Referring to FIGS. 3A and 4, it may be desirable to pattern the exterior surface 133 of the tube wall 134 in some embodiments. Accordingly, a determination may be made at block 410 whether an outside patterned structure is needed or desired. If so, the process may move to block 412. If not, the process may move to block 414.

At block 412, a pattern may be formed on the outside surface of the cooling tube 130. That is, a pattern may be deposited or otherwise formed on the exterior surface 133 of tube wall 134. The process for forming a pattern is not limited by the present disclosure, and may generally be any forming process, including those not described herein. In some embodiments, the pattern formed on the exterior surface 133 of the tube wall 134 may be similar to the process described herein with respect to the interior surface 135 of the tube wall 134. In such embodiments, the processes described with respect to blocks 404-408 may be repeated for the exterior surface 133 of the tube wall 134. Upon formation of the pattern according to block 412, the process may move to block 414.

At block 414, the cooling tube 130 may be coupled to additional components in some embodiments. That is, the cooling tube 130 may be coupled to other components of the cooling device 110 (FIG. 1) to form the cooling device 110, as described herein. For example, the cooling tube 130 may be coupled to the substrate 112 (such as the surface 114 of the substrate 112 (FIG. 1)). In some embodiments, the cooling tube 130 may be coupled to (or positioned to contact) the one or more heat generating devices 121 (FIG. 1). In another example, the cooling tube 130 may be integrated within the stack 100 (FIG. 1) by providing the substrate 112, depositing a first solder layer or bond layer (e.g., the TLP bond layer) on the substrate 112, placing the cooling tube 130 (and/or additional cooling tubes 130) on the first solder layer or bond layer, depositing a second solder layer or bond layer (e.g., a TLP bond layer) on the cooling tube(s) 130, and placing the heat generating devices 121 on the second solder layer or bond layer.

The processes described with respect to FIG. 4 are merely illustrative, and other processes may be used in the alternative. Also, FIG. 4 is described with respect to a single tube. However, it should be understood that the processes described with respect to FIG. 4 can be completed for a plurality of tubes.

It should now be understood that the present disclosure relates to cooling devices for cooling electronics that utilize sub-millimeter sized cooling tubes to direct fluid to a location adjacent to a heat generating device (e.g., an electronic device) to be cooled. The sub-millimeter sized cooling tubes generally have a patterned internal surface that provides a greater surface area for heat transfer relative to similar tubes that do not have a patterned internal surface or have a differently patterned internal surface. The present disclosure further relates to a particular method of forming a pattern of material on the internal surface of the cooling tubes.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A method of forming a tube for a cooling device, the method comprising:
   positioning an opal structure on an interior surface of the tube, the opal structure comprising voids around a plurality of spheres;
   depositing a material over the opal structure and within the voids around the plurality of spheres; and
   removing the opal structure such that the material forms a patterned structure comprising a plurality of dimples and a plurality of pores.

2. The method of claim 1, further comprising providing the tube, the tube having an outside diameter of less than 1 millimeter (mm).

3. The method of claim 1, further comprising depositing an insulator material on the patterned structure.

4. The method of claim 1, wherein depositing the material comprises depositing aluminum, nickel, copper, silver, gold, an alloy containing any of the foregoing, or a compound containing any of the foregoing.

5. The method of claim 1, wherein depositing the material comprises depositing the material via chemical vapor deposition, electrodeposition, epitaxy, or thermal oxidation.

6. The method of claim 1, wherein removing the opal structure comprises applying an etchant to the opal structure.

7. A cooling device comprising:
   at least one tube having an outside diameter of less than one millimeter, the at least one tube comprising:
      a tube wall defining a hollow interior and having an interior surface, and
      a patterned structure disposed on the interior surface, the patterned structure having an inverse opal structure.

8. The cooling device of claim 7, wherein the inverse opal structure is a metal inverse opal structure.

9. The cooling device of claim 7, further comprising an insulator material deposited on the patterned structure.

10. The cooling device of claim 7, wherein the patterned structure is constructed from aluminum, nickel, copper, silver, gold, an alloy containing any of the foregoing, or a compound containing any of the foregoing.

11. The cooling device of claim 7, wherein the at least one tube is adapted to receive a cooling fluid within the hollow interior such that the cooling fluid contacts the patterned structure.

12. The cooling device of claim 7, wherein the cooling device is an active cooling device.

13. The cooling device of claim 7, wherein the cooling device is a passive cooling device.

14. The cooling device of claim 7, further comprising a substrate supporting the at least one tube.

15. A system comprising:
   a heat generating device; and
   cooling device thermally coupled to the heat generating device, the cooling device comprising:
      at least one tube having an outside diameter of less than one millimeter, the at least one tube comprising:
         a tube wall defining a hollow interior and having an interior surface, and
         a patterned structure disposed on the interior surface, the patterned structure having an inverse opal structure.

16. The system of claim 15, wherein the inverse opal structure is a metal inverse opal structure.

17. The system of claim 15, wherein the inverse opal structure comprises at least one of a plurality of dimples and a plurality of pores.

18. The system of claim 15, wherein the patterned structure is constructed from aluminum, nickel, copper, silver, gold, an alloy containing any of the foregoing, or a compound containing any of the foregoing.

19. The cooling device of claim 15, wherein the heat generating device is a wide bandgap semiconductor device and the cooling device further comprises a substrate supporting the at least one tube, the at least one tube fixed to the substrate via a solder layer or a transient liquid phase (TLP) bond layer.

20. The system of claim 15, wherein the heat generating device is an insulated-gate bipolar transistor (IGBT), a diode, a transistor, an integrated circuit, a silicon-controlled rectifier (SCR), a thyristor, a gate turn-off thyristor (GTO), a triac, a bipolar junction transistor (BJT), a power metal oxide semiconductor field-effect transistor (MOSFET), a MOS-controlled thyristor (MCT), or an integrated gate-commutated thyristor (IGCT).

* * * * *